United States Patent
Samavedam et al.

(10) Patent No.: US 6,423,632 B1
(45) Date of Patent: Jul. 23, 2002

(54) SEMICONDUCTOR DEVICE AND A PROCESS FOR FORMING THE SAME

(75) Inventors: Srikanth B. Samavedam; Philip J. Tobin, both of Austin; William J. Taylor, Jr., Round Rock, all of TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/621,804

(22) Filed: Jul. 21, 2000

(51) Int. Cl.[7] .............................................. H01L 21/44
(52) U.S. Cl. ..................... 438/652; 438/655; 438/656; 438/657; 438/682; 438/683; 438/592; 257/751; 257/755; 257/754
(58) Field of Search .............................. 438/592, 653, 438/655, 644, 682, 652, 656, 657, 666, 683, 684, 685; 257/751, 755, 770, 750, 754, 757, 761–766

(56) References Cited

U.S. PATENT DOCUMENTS

| | | | | |
|---|---|---|---|---|
| 5,364,803 A | * | 11/1994 | Lur et al. | 438/592 |
| 5,504,041 A | | 4/1996 | Summerfelt | 438/396 |
| 5,510,651 A | | 4/1996 | Maniar et al. | 257/751 |
| 5,559,047 A | | 9/1996 | Urabe | 438/301 |
| 5,576,579 A | * | 11/1996 | Agnello et al. | 257/751 |
| 5,665,628 A | | 9/1997 | Summerfelt | 438/3 |
| 5,780,350 A | * | 7/1998 | Kapoor | 438/305 |
| 5,861,340 A | * | 1/1999 | Bai et al. | 438/592 |
| 5,998,289 A | | 12/1999 | Sagnes | 438/592 |
| 6,121,086 A | * | 9/2000 | Kuroda et al. | 438/256 |
| 6,180,469 B1 | * | 1/2002 | Pramanick et al. | 438/299 |
| 2001/0014522 A1 | * | 8/2001 | Weimer et al. | 438/591 |

FOREIGN PATENT DOCUMENTS

WO    WO 99/43024    8/1999    ........... H01L/21/28

OTHER PUBLICATIONS

J.S.Reid et al., "Evaluation of amorphous (Mo, Ta, W) –Si–N diffusion barriers for <Si>/Cu metallizations", 1993 Elsevier Sequoia, pp. 319–324.

Renaud Fix et al., "Chemical Vapor Deposition of Vanadium, Niobium, and Tantalum Nitride Thin Films", Chemical Material 1993, 5, pp. 614–619.

Y.V. Ponomarev et al., "Gate–Workfunction Engineering Using Poly–(Si,Ge) for High–Performance 0.18$\mu$m CMOS Technology", e–mail address:ponomarv@natlab.research.philips.com, pp. 33.3.1–33.3.4.

Wen–Chun Wang et al., "Diffusion barrier study on TaSix and TaSix Ny", 1993 Elsevier Sequoia, pp. 169–174.

K.Kasai et al., "W/WNx/Poly–Si Gate Technology for Future High Speed Deep Submicron CMOS LSIs", 1994 IEEE, pp. 19.4.1–19.4.1.

Yasushi Akasaka et al., "Low–Resistivity Poly–Metal Gate Electrode Durable for high–Temperature Processing", 1996 IEEE, pp. 1864–1868.

* cited by examiner

Primary Examiner—Wael Fahmy
Assistant Examiner—Hsien-Ming Lee
(74) Attorney, Agent, or Firm—James L. Clingan, Jr.

(57) ABSTRACT

A semiconductor device and a process for forming the device includes a conductor that overlies an insulating layer. In one embodiment, the conductor includes a first conductive portion, a second conductive portion, and a third conductive portion. The second conductive portion lies between the first and third conductive portions. The first conductive portion includes a first element, and the third conductive portion includes a metal and silicon without a significant amount of the first element. In another embodiment, the conductor is a gate electrode or a capacitor electrode. The conductor includes a first conductive portion, a second conductive portion, a third conductive portion, and a fourth conductive portion. The second conductive portion lies between the first and third conductive portions and has a different composition compared to the first, third, and fourth conductive portion. The third conductive portion lies between the second and fourth conductive portions and has a different composition compared to the first and fourth conductive portions.

28 Claims, 3 Drawing Sheets

SEMICONDUCTOR DEVICE AND A PROCESS FOR FORMING THE SAME

FIELD OF THE INVENTION

The present invention relates generally to the fields of semiconductor devices and processing. More particularly, it concerns semiconductor devices, and processes for forming the same that include a conductor having a varying composition.

RELATED ART

Polycrystalline silicon germanium alloy (SiGe) gate electrodes help reduce poly depletion effects in N- and P-MOSFETS. However, silicon germanium alloy is typically incompatible with certain silicide integrations. In particular, SiGe is incompatible with metal silicide integrations such as cobalt silicide integration or titanium silicide integration. In these cases, cobalt forms a high resistivity phase with underlying germanium or titanium to form, for instance, cobalt germanide (CoGe), cobalt digermanide ($CoGe_2$), titanium germanide (TiGe), or titanium digermanide ($TiGe_2$).

Further, germanium tends to segregate at the silicide/poly interface. This segregation may be disadvantageous in that germanium may be drawn away from the gate dielectric interface. This, in turn, may negatively affect the work function of the device; specifically, the work function may be increased.

In order to overcome such problems, a silicon layer may be formed on a silicon germanium alloy to provide a layer of silicon for silicidation. During the silicidation process, some of this silicon layer may be consumed. Although this technique has exhibited at least a degree of utility, problems nevertheless remain. In particular, germanium tends to diffuse into the silicon layer during each and every time-temperature cycle that is performed as a device is formed. This depletes the silicon germanium layer close to the dielectric and some of the benefit from the silicon germanium gate electrode (reduction in the poly depletion effect) may be lost. Even in the presence of this additional silicon layer, diffused germanium in the silicon layer may form $CoGe_2$, CoGe, TiGe, and/or $TiGe_2$ and adversely affect the gate silicide sheet resistance. Specifically, the sheet resistance may increase due to presence of these germanium compounds.

In one reference, a thin nitrided silicon film may be placed on top of a silicon layer. This nitrided silicon film may reduce the amount of up-diffusion from a gate level; however, because the nitrided silicon film is an insulating layer, that layer may negatively affect the performance of the device due to higher sheet resistance.

Problems enumerated above are not intended to be exhaustive, but rather are among many that tend to impair the effectiveness of previously known devices and techniques. Other noteworthy problems may also exist; however, those presented above should be sufficient to demonstrate that methodology appearing in the art have not been altogether satisfactory. In particular, existing techniques do not adequately account for and/or prevent up diffusion of certain elements that may have adverse affects on device performance and do not prevent the formation of performance-hampering compounds such as CoGe, $CoGe_2$, TiGe, or $TiGe_2$.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

In one embodiment, the present disclosure describes a semiconductor device including an insulating layer and a conductor and a method of its formation. The insulating layer is formed over a semiconductor substrate, and the conductor is formed over the insulating layer. The conductor includes a first conductive portion, a second conductive portion, and a third conductive portion. The second conductive portion lies between the first and third conductive portions. The first conductive portion includes a first element, and the third conductive portion includes a metal and silicon without a significant amount of the first element.

In another embodiment, the present disclosure describes a semiconductor device including an insulating layer and a conductor. The insulating layer overlies a semiconductor substrate, and the conductor overlies the insulating layer. The conductor is a gate electrode or a capacitor electrode. The conductor includes a first conductive portion, a second conductive portion, a third conductive portion, and a fourth conductive portion. The second conductive portion lies between the first and third conductive portions and has a different composition compared to the first, third, and fourth conductive portions. The third conductor portion lies between the second and fourth conductive portions and has a different composition compared to the first and fourth conductive portions. The present invention is defined by the appended claims and is better understood when read in light of the embodiments described herein.

Figure 1:
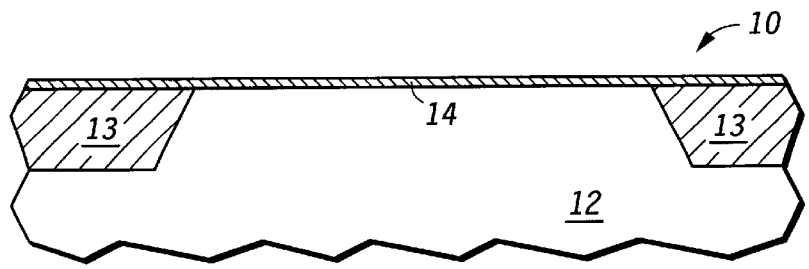
FIG. 1 includes an illustration of a cross-sectional view of a portion of a semiconductor device including an isolation region and a gate dielectric.

FIG. 1 includes a semiconductor device 10 according to one embodiment of the present disclosure. Included in this semiconductor device is a semiconductor device substrate 12, isolation region 13, and gate dielectric 14. Semiconductor device substrate 12 may include a silicon wafer, silicon germanium wafer, silicon-on-insulator wafer, or any other substrate used in forming semiconductor devices. Isolation regions 13 may include thermal silicon dioxide, deposited silicon dioxide, silicon oxynitride, or any other insulating materials known in the art. Isolation regions 13 may be formed by thermal growth, chemical vapor deposition (CVD), or any other process known in the art. Gate dielectric 14, which is an insulating layer, may include silicon dioxide, zirconium oxide, or any other dielectric film. The thickness of gate dielectric film 14 may vary; however, in one embodiment the thickness may be in the range of approximately 0.2–12.0 nanometers.

Figure 2:
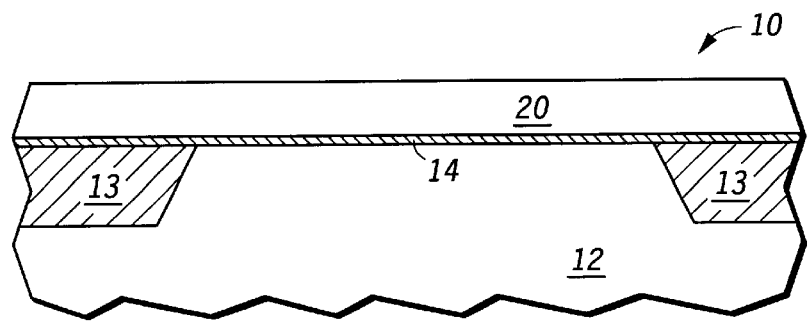
FIG. 2 includes an illustration of FIG. 1 after forming a first conductive portion.

Turning next to FIG. 2, a first conducting film 20 is formed over the gate dielectric layer 14. In one embodiment, this first conducting film 20 may include a gate electrode or a capacitor electrode. In general this first conducting film 20 may contain one or more Group IVA elements (i.e., C, Si, Ge, Sn, Pb). In particular, this first conducting film 20 may include silicon germanium. In one embodiment, the first conducting film 20 may have approximately 5–75 atomic percent germanium. First conducting film 20 may also include silicon-germanium-carbon alloys. Although one of ordinary skill in the art understands that the thickness of first conducting film 20 may vary substantially, in one embodiment, a thickness in a range of approximately 20–150 nanometers may be used. In one particular embodiment, the thickness of this film may be approximately 120 nanometers. As is known in the art, first conducting film 20 may be deposited by many different methodologies, such as, but not limited to, CVD. As is known in the art, first conducting film 20 may be doped with one or more elements. In one embodiment, first conducting film 20 may be subjected to one or more doping steps prior to the deposition of the subsequently formed films illustrated in FIGS. 3–8. Such an implantation may be referred to as a pre-doping sequence.

Figure 3:
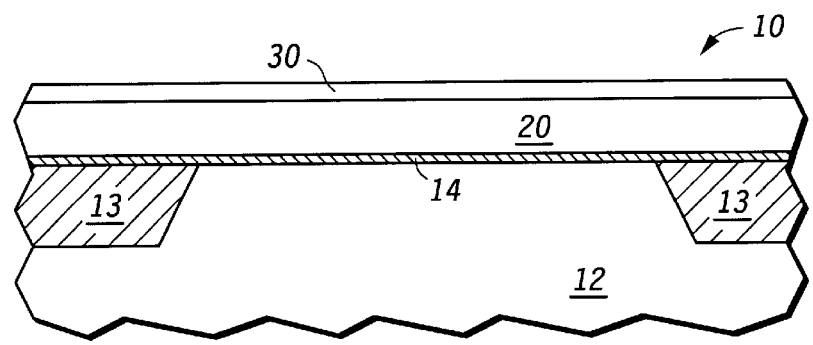
FIG. 3 includes an illustration of FIG. 2 after forming a second conductive portion.

Turning next to FIG. 3, a second conductive portion 30 is formed over the first conducting film 20 (also referred to as the first conductive portion). In one embodiment, this second conducting portion 30 may be a barrier film (or barrier layer). In particular, this barrier film may include a metal or a metal with elements such as nitrogen, oxygen, and carbon such as metal nitride, metal carbide and/or a metal oxynitride and/or metal oxy-nitridecarbide. In one embodiment, this second conductive portion may be utilized to reduce or prevent up-diffusion of one or more elements from first conducting portion 20. Specifically, in an embodiment wherein the first conducting film 20 includes silicon germanium, second conducting portion 30 may be a barrier film that prevents the up-diffusion of germanium. As discussed earlier, the prevention of such up-diffusion may be beneficial in that the formation of detrimental compounds such as cobalt germanide may be reduced or prevented altogether. This in turn, may lead to better device performance stemming from, for instance, a lower sheet resistivity.

The second conducting portion 30 may have various thicknesses as understood by one of skilled in the art; however, in one embodiment the thickness may be in a range of approximately 3–50 nanometers. In one embodiment, the range may be approximately 10–30 nanometers, and yet in a more specific embodiment the thickness may be approximately 15 nanometers. This film may be deposited by any methodology known in the art. For instance, CVD or PVD may be used. In one embodiment, first conducting portion 20 may be implanted, in a pre-doping sequence, through second conducting portion 30.

Figure 4:
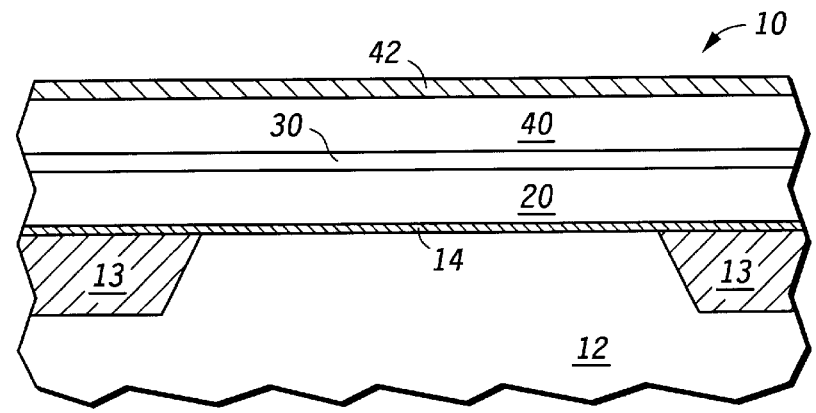
FIG. 4 includes an illustration of FIG. 3 after forming a third conductive portion)

Turning next to FIG. 4, a third conductive portion 40 is formed over the second conductive portion 30. In one embodiment, this third conductive portion 40 may be polysilicon. Specifically, this conductive film may be a cap film that aids in a silicidation process. Although its thicknesses may vary significantly, in one embodiment the thickness may in a range of approximately 20–200 nanometers. In one embodiment, the thickness may be in a range of approximately 30–100 nanometers. In yet a more specific embodiment, the thickness may be approximately 50 nanometers. This film may be deposited by any methodology known in the art, such as, but not limited to, CVD. As is known in the art, this film may be implanted with one or more conductivity-enhancing dopants to increase its conductivity.

Also shown in FIG. 4 is an optional anti-reflective coating (ARC) 42. In one embodiment, ARC 42 may be a film of silicon nitride. This film of silicon nitride may have a thickness in a range of approximately 10–50 nanometers. It is understood that this film may be included to improve resolution during lithography. ARC 42 may be deposited by any method known in the art.

Figure 5:
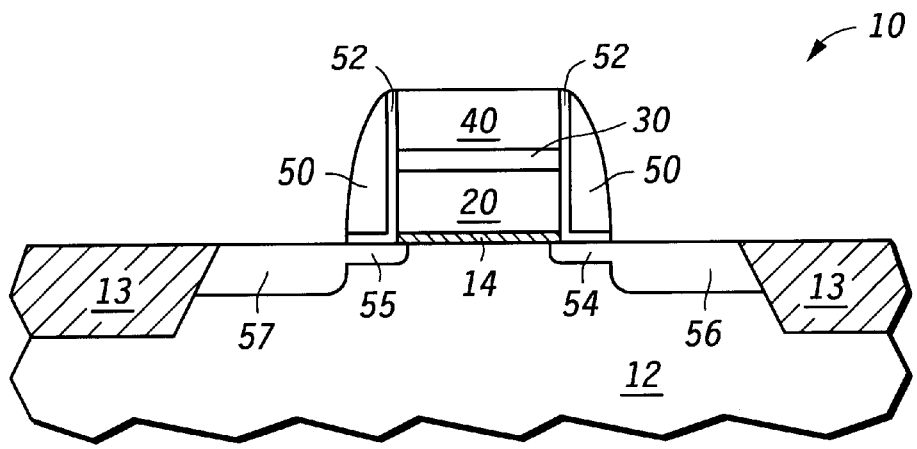
FIG. 5 includes an illustration of FIG. 4 after forming sidewall spacers and extension and source/drain implants.

Turning next to FIG. 5, sidewall spacers 50, liner dielectric 52, lightly doped source and drain 55 and 54, and heavy doped source and drain 57 and 56 are then formed. To arrive at the device depicted in FIG. 5, the device of FIG. 4 may be patterned as is known in the art. Sidewall spacers 50 may be any spacer commonly used in the art. In one embodiment, sidewall spacers 50 may be silicon nitride deposited by CVD. Liner dielectric 52 may be deposited with TEOS. Its thickness may vary significantly. In one embodiment, its thickness may be in a range of approximately 5–25 nanometers. Regions 54 and 55 are doped regions that may be formed by ion implantation as is known in the art. Regions 56 and 57 are similarly formed via ion implantation as is known in the art. Doses for regions 54 and 55 may be between about $2\times10^{14}$ to about $1\times10^{15}$ ions per centimeter$^2$. Regions 56 and 57 may have doses between about $2\times10^{15}$ to about $6\times10^{15}$ ions per centimeter$^2$. Those having skill in the art understand that different doses and species may be used for such doping.

Figure 6:
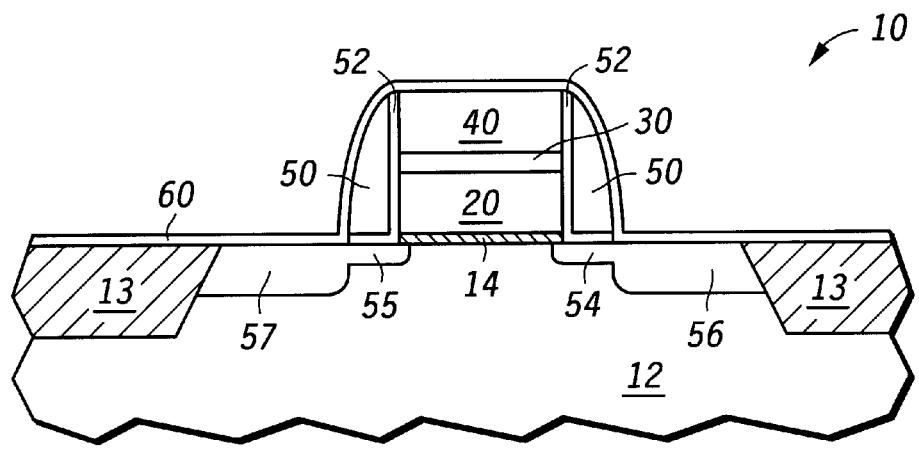
FIG. 6 includes an illustration of FIG. 5 after depositing a metal film.

Turning next to FIG. 6, a film 60 is deposited. Although any metal may be used for such a film as is known in the art, in one embodiment, metal film 60 may include cobalt, titanium, and/or nickel. Although its thickness may vary, in one embodiment its thickness may be in a range of approximately 5–25 nanometers. In one embodiment, its thickness may be in a range of approximately 10–20 nanometers. In yet a more specific embodiment, its thickness may be approximately 10 nanometers. This film may be deposited by any means known in the art including, but not limited to CVD or PVD.

Figure 7:
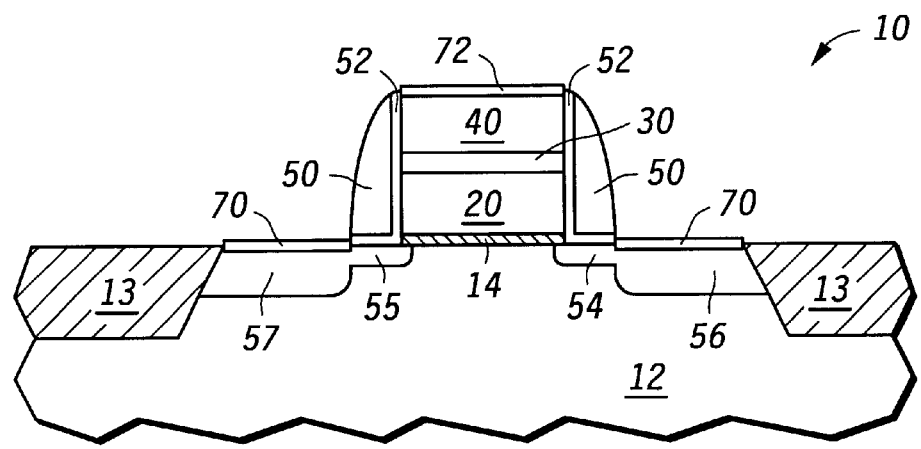
FIG. 7 includes an illustration of FIG. 6 after reacting a metal film to form a silicide.

Turning next to FIG. 7, silicide films 70 and 72 are formed by reacting the deposited metal film 60 with exposed silicon. As may be seen by close inspection of FIG. 7, at least a portion of silicon has been consumed in the formation of silicide films 70 and 72. Although the amount of silicon consumed may vary significantly, in one embodiment it is contemplated that approximately 30 nanometers may be consumed.

Figure 8:
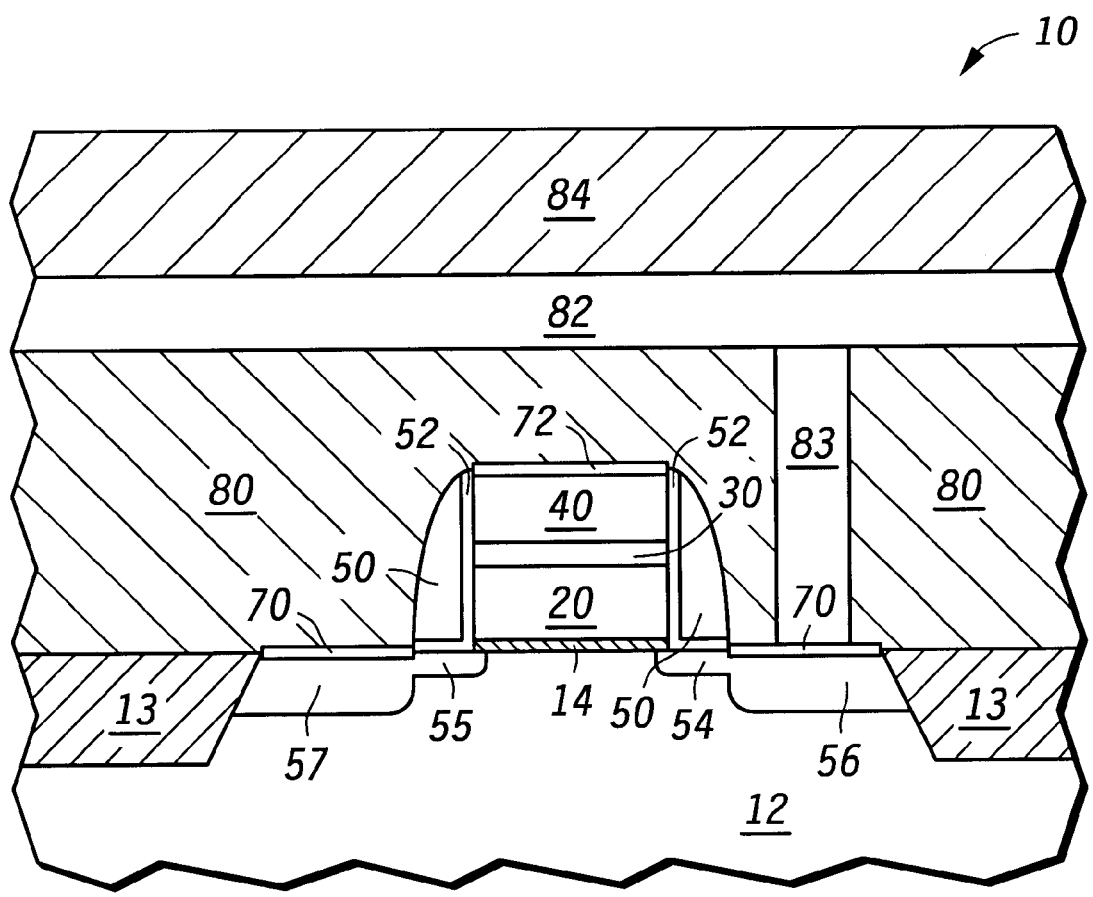
FIG. 8 includes an illustration of FIG. 7 after forming a substantially completed semiconductor device.

Turning finally to FIG. 8, a dielectric film 80, conductive plug 83, interconnect conducting film 82, and passivation film 84 are formed. Dielectric film 80 may include a variety of different substances, including, but not limited to, TEOS or BPSG. Interconducting plug 83 may include tungsten, or any other conducting metal as is known in the art. Interconnect conducting film 82 may include aluminum, copper, or any other conducting material known in the art. Passivation film 84 may include silicon oxynitride, PSG covered by silicon nitride, or the like. The thicknesses in composition of films 80, 83, 82 and 84 may all vary as is known in the art.

With reference to FIGS. 1–8, advantages of the present disclosure may be discerned. Specifically, with reference to FIG. 5, second conducting film 30 may provide significant advantages. Specifically, during formation of sidewall spacers 50, semiconductor device 10 may be subjected to temperatures in excess of about 700° C. At these temperature ranges, one or more elements within first conducting region 20 may up-diffuse toward third conducting region 40. Without second conducting region 30 separating first conducting region 20 and third conducting region 40, this up-diffusion may proceed so that one or more elements could become part of third conducting region 40, which may create deleterious effects upon the entire device. In particular, the up-diffusion may increase sheet resistivity. Even more specifically, if first conducting region 20 includes silicon germanium, up-diffusion of germanium into third conducting region 40 may lead to the formation of, for instance, cobalt germanide, cobalt digermanide, titanium germanide, and/or titanium digermanide during the reaction steps shown in FIGS. 6 and 7.

Further, the loss of germanium from the first conducting layer will increase the work function of the layer. However, with the presence of second conducting film 30, the up-diffusion may be reduced or eliminated altogether. Furthermore, because second conducting film 30 is conductive, the vertical resistivity of the stack shown by films 20, 30 and 40 may not be negatively impacted.

With reference to FIG. 5, semiconductor device 10 is also subjected to high temperatures during source and drain dopant activation anneal steps. During such steps, the device may experience temperatures up to about 1050° C. As explained above, such high temperatures may lead to the up-diffusion of certain elements within first conducting film 20. This up-diffusion, again, may negatively impact the performance of the device due to increased sheet resistivity and a different work function. The presence of second conducting film 30 prevents this from occurring, while at the same time, not negatively affecting the vertical resistivity of the stack.

Likewise, with reference to FIG. 7, the device 10 may be subjected to high temperatures during silicide reaction steps. In particular, temperatures during this step may be in excess of 800° C. As explained above, these high temperatures may cause up-diffusion which may be reduced or eliminated by second conducting film 30.

With reference to FIGS. 2–3, another advantageous feature of the present disclosure may be seen. Subsequent to the deposition of first conducting film 20, film 20 may be implanted such that the concentration profile of one or more elements may be graded. In particular, in embodiments utilizing germanium in first conducting film 20, implantation may be carried out such that the concentration of germanium near the upper surface of first conducting film 20 is significantly less than the concentration of germanium near gate oxide 14. The difference in germanium concentration may vary significantly, as is known in the art. In one embodiment, the difference in germanium concentration may vary by one or more orders of magnitude from the upper surface of first conducting film 20 and the upper surface of gate dielectric 14. The grading in concentration discussed above may advantageously decrease, or eliminate, the up-diffusion of one or more elements so as to prevent decreased performance due to the formation of unwanted, high-resistance compounds such as, for instance, CoGe, $CoGe_2$, TiGe, and/or $TiGe_2$.

To summarize some of the embodiments, a conducting barrier film may be used between (directly between or separated by one or more intervening films or layers) two conductive portions so as to prevent, or even eliminate, the diffusion of one or more elements between those conductive portions. In one embodiment, such a thin conducting barrier film may include metal, metal nitride, metal carbide, metal oxide and/or metal oxynitride and/or metal oxynitride-carbide (such as TiCNO). Such a film may operate to prevent up-diffusion of certain elements, such as germanium, into an adjacent film, such as a silicon cap film. In one embodiment, a silicon germanium film may be implanted before the barrier film formation to ensure a high dopant concentration in the silicon germanium film close to the dielectric/silicon germanium interface. The top silicon film may be implanted after the barrier film formation to ensure a low resistance contact with a silicide, such as cobalt silicide. The germanium concentration in the silicon germanium film may be graded down near the barrier film/silicon germanium interface to reduce the driving force for germanium up-diffusion. The thickness of the individual films in the above-described steps may be adjusted, as is known in the art, for an optimal structure.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a nonexclusive inclusion, such that a process, method, article, or apparatus that comprises a list of elements does not include only those elements but may include other elements not expressly listed or inherent to such process, method, article, or apparatus.

What is claimed is:

1. A semiconductor device comprising:
    an insulating layer overlying a substrate; and
    a conductor overlying the insulating layer, wherein:
        the conductor includes a first conductive portion, a second conductive portion, a third conductive portion, and a silicon-containing layer between the second conductive portion and the third conductive portion;
        the second conductive portion lies between the first and third conductive portions;
        the first conductive portion includes a first element; and
        the third conductive portion includes a metal and silicon without a significant amount of the first element.

2. The semiconductor device of claim 1, wherein the second conductive portion includes a barrier layer.

3. The semiconductor device of claim 1, wherein:
    the third conductive portion includes a metal silicide; and
    the second conductive portion includes a barrier layer.

4. The semiconductor device of claim 1, wherein:
    the first element is a Group IVA element;
    the first conductive portion further includes a different Group IVA element; and
    the third conductive portion includes the different Group IVA element.

5. The semiconductor device of claim 1, wherein:
the conductor is a gate electrode;
the first conductive portion includes silicon;
the first element is germanium;
the second conductive portion includes a barrier layer;
the barrier layer includes a metal and a second element selected from a group consisting of nitrogen, oxygen, and carbon; and
the third conductive portion includes a metal silicide.

6. The semiconductor device of claim 1, wherein:
the first element is germanium; and
the first conductive portion includes silicon and has approximately 5–75 atomic percent germanium.

7. The semiconductor device of claim 1, wherein:
the first conductive portion has a first region closer to the substrate compared to a second region that is closer to the second conductive portion compared to the first region; and
the first region has a significantly higher concentration of the first element compared to the second region.

8. The semiconductor device of claim 1, wherein the first conductive portion further comprises a conductivity-enhancing dopant.

9. The semiconductor device of claim 1, wherein the semiconductor device further comprises a silicon film including a conductivity-enhancing dopant.

10. A semiconductor device comprising:
an insulating layer overlying a substrate; and
a conductor overlying the insulating layer, wherein:
the conductor is selected from a group consisting of a gate electrode and a capacitor electrode;
the conductor includes a first conductive portion, a second conductive portion, a third conductive portion, and a fourth conductive portion;
the fourth conductive portion includes a metal silicide;
the second conductive portion includes a barrier layer;
the second conductive portion lies between the first and third conductive portions and has a different composition compared to the first, third, and fourth conductive portion; and
the third conductive portion lies between the second and fourth conductive portions and has a different composition compared to the first and fourth conductive portions.

11. The semiconductor device of claim 10, wherein the third conductive portion comprises silicon.

12. The semiconductor device of claim 10, wherein:
the first conductive portion comprises a first element that is a Group IVA element;
the first conductive portion further includes a different Group IVA element; and
the third conductive portion includes the different Group IVA element.

13. The semiconductor device of claim 10, wherein:
the conductor is a gate electrode;
the first conductive portion includes silicon and germanium;
the barrier layer includes a metal and a second element selected from a group consisting of nitrogen, oxygen and carbon;
the third conductive portion includes silicon; and
the fourth conductive portion includes a metal silicide.

14. The semiconductor device of claim 10, wherein the first conductive portion has approximately 5–75 atomic percent germanium.

15. The semiconductor device of claim 10, wherein:
the first conductive portion has a first region closer to the substrate compared to a second region that is closer to the second conductive portion compared to the first region; and
the first region has a significantly higher concentration of the germanium compared to the second region.

16. The semiconductor device of claim 10, wherein the first conductive portion further comprises a conductivity-enhancing dopant.

17. The semiconductor device of claim 10, wherein the third conductive portion further comprises a conductivity-enhancing dopant.

18. A process for forming a semiconductor device comprising:
forming an insulating layer overlying a substrate; and
forming a conductor overlying the insulating layer, wherein:
the conductor includes a first conductive portion, a second conductive portion, a third conductive portion, and a fourth conductive portion;
the second conductive portion lies between the first and third conductive portions;
the fourth conductive portion lies between the second and third conductive portions;
the fourth conductive portion comprises silicon;
the first conductive portion includes a first element; and
the third conductive portion includes a metal and silicon without a significant amount of the first element.

19. The process of claim 18, wherein the second conductive portion includes a barrier layer.

20. The process of claim 18, wherein forming the conductor comprises:
forming a silicon layer over the second conductive portion;
forming a metal layer over the silicon layer; and
reacting a first portion of the silicon layer with the metal layer to form a metal silicide as the third conductive portion and leaving a remaining portion of the silicon layer as the fourth conductive portion, wherein the second conductive portion substantially prevents the first element from reacting with the metal layer.

21. The process of claim 18, wherein:
the third conductive portion includes a metal silicide; and
the second conductive portion substantially prevents the first element from diffusing into the third conductive portion.

22. The process of claim 18, wherein:
the first element is a Group IVA element;
the first conductive portion further includes a different Group IVA element; and
the third conductive portion includes the different Group IVA element.

23. The process of claim 18, wherein:
the conductor is a gate electrode;
the first conductive portion includes silicon;
the first element is germanium;
the second conductive portion includes a barrier layer;
the barrier layer includes a metal and a second element selected from a group consisting of nitrogen, oxygen and carbon; and
the third conductive portion includes a metal silicide.

24. The process of claim 18, wherein forming the conductor includes:
- forming the first conductive portion; and
- forming the second conductive portion after forming the first conductive portion; and the process further includes exposing the first and second conductive portions to a temperature of at least approximately 600° C.

25. The process of claim 18, wherein:

the first element is germanium; and the first conductive portion includes silicon and has approximately 5–75 atomic percent germanium.

26. The process of claim 18, wherein:

the first conductive portion has a first region closer to the substrate compared to a second region that is closer to the second conductive portion compared to the first region; and the first region has a significantly higher concentration of the first element compared to the second region.

27. The process of claim 18, wherein forming the conductor includes:
- forming the first conductive portion;
- doping at least a part of the first conductive portion; and
- forming the second conductive portion after doping the at least a part of the first conductive portion, wherein the second conductive portion includes a barrier layer.

28. The process of claim 18, wherein the process further comprises:
- forming a silicon layer over the second conductive portion;
- doping portions of the substrate and the silicon layer; and
- forming the third conductive portion from at least a part of the silicon layer.

* * * * *